United States Patent
Gupta et al.

(10) Patent No.: US 10,475,729 B2
(45) Date of Patent: Nov. 12, 2019

(54) PACKAGED SEMICONDUCTOR DEVICE WITH A PARTICLE ROUGHENED SURFACE

(71) Applicant: Texas Instruments Incorporated, Dallas, TX (US)

(72) Inventors: Vikas Gupta, Dallas, TX (US); Daniel Yong Lin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/252,412

(22) Filed: Jan. 18, 2019

(65) Prior Publication Data

US 2019/0157195 A1 May 23, 2019

Related U.S. Application Data

(63) Continuation of application No. 15/842,608, filed on Dec. 14, 2017, now Pat. No. 10,186,478.

(60) Provisional application No. 62/440,950, filed on Dec. 30, 2016.

(51) Int. Cl.
*H01L 23/495* (2006.01)
*H01L 23/31* (2006.01)

(52) U.S. Cl.
CPC .... *H01L 23/49579* (2013.01); *H01L 23/3107* (2013.01); *H01L 23/3142* (2013.01); *H01L 23/4952* (2013.01); *H01L 23/49513* (2013.01); *H01L 23/49575* (2013.01); *H01L 23/49582* (2013.01); *H01L 23/49586* (2013.01); *H01L 23/49541* (2013.01); *H01L 2224/16245* (2013.01); *H01L 2224/80815* (2013.01); *H01L 2924/181* (2013.01)

(58) Field of Classification Search
CPC ........... H01L 23/3107; H01L 23/49513; H01L 23/3142; H01L 23/4952; H01L 23/49575; H01L 23/49582; H01L 23/49586; H01L 23/49579
USPC ........................................................ 257/676
See application file for complete search history.

(56) References Cited

U.S. PATENT DOCUMENTS

| | | | |
|---|---|---|---|
| 6,831,372 B2 * | 12/2004 | Ruhland | H01L 23/3107 257/666 |
| 6,858,919 B2 | 2/2005 | Seo et al. | |
| 7,382,059 B2 | 6/2008 | Anderson et al. | |
| 7,443,015 B2 | 10/2008 | Punzalan et al. | |
| 7,645,640 B2 | 1/2010 | Lee et al. | |
| 7,691,681 B2 | 4/2010 | Lee | |

(Continued)

FOREIGN PATENT DOCUMENTS

RU 2438845 C1 7/2010
WO 2012164437 A2 12/2012

*Primary Examiner* — Luan C Thai
(74) *Attorney, Agent, or Firm* — Dawn Jos; Charles A. Brill; Frank D. Cimino

(57) ABSTRACT

A packaged semiconductor device with a particle roughened surface on a portion of the lead frame that improves adhesion between the molding compound and the lead frame. A packaged semiconductor device with a particle roughened surface on a portion of the lead frame that improves adhesion between the molding compound and the lead frame and with a reflow wall that surrounds a portion of the solder joint that couples the semiconductor device to the lead frame. A packaged semiconductor device with a reflow wall that surrounds a portion of a solder joint that couples a semiconductor device to a lead frame.

20 Claims, 13 Drawing Sheets

(56) References Cited

U.S. PATENT DOCUMENTS

2002/0130397 A1 9/2002 Yew et al.
2013/0292684 A1 11/2013 Nikitin et al.

* cited by examiner

PACKAGED SEMICONDUCTOR DEVICE WITH A PARTICLE ROUGHENED SURFACE

CROSS REFERENCE TO RELATED APPLICATIONS

This is a continuation of patent application Ser. No. 15/842,608, filed Dec. 14, 2017, which claims the benefit of Provisional Patent Application No. 62/440,950, filed Dec. 30, 2016, the contents of which are herein incorporated by reference in its entirety.

TECHNICAL FIELD

This disclosure relates to the field of packaged semiconductor devices. More particularly, this disclosure relates to packaged semiconductor devices with improved adhesion between the molding compound and lead frame.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A packaged semiconductor device with a particle roughened surface on a portion of the lead frame with molding compound. A packaged semiconductor device with a particle roughened surface on a portion of the lead frame with molding compound, with a reflow wall that surrounds a portion of a solder joint that couples the semiconductor device to the lead frame. The particle roughened surface may aid in adhesion between the molding compound and the lead frame.

A packaged semiconductor device with a lead frame and a semiconductor device. A solder joint is coupled between the lead frame and a terminal on the semiconductor device. A reflow wall is on a portion of the lead frame and in contact with the solder joint. Molding compound covers portions of the semiconductor device, the lead frame, the solder joint, and the reflow wall.

DETAILED DESCRIPTION OF EXAMPLE EMBODIMENTS

Embodiments of the disclosure are described with reference to the attached figures. The figures are not drawn to scale and they are provided merely to illustrate the disclosure. Several aspects of the embodiments are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The embodiments are not limited by the illustrated ordering of acts or events, as some acts may occur in different orders and/or concurrently with other acts or events. Furthermore, not all illustrated acts or events are required to implement a method.

Figure 1A:
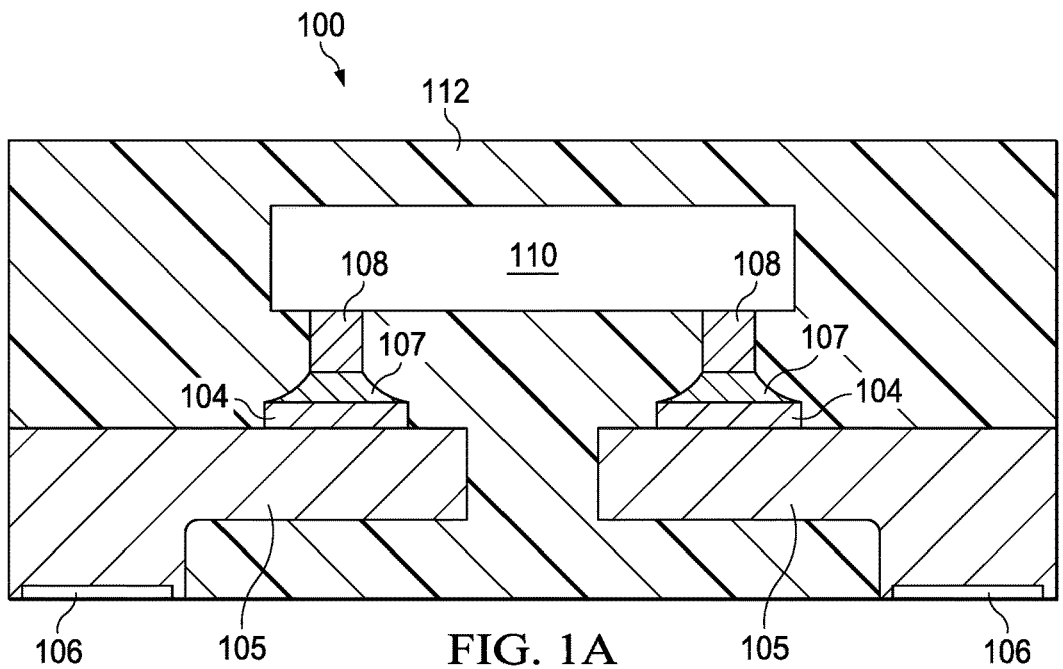
FIG. 1A is a cross-section of a packaged semiconductor device.
Figure 1B:
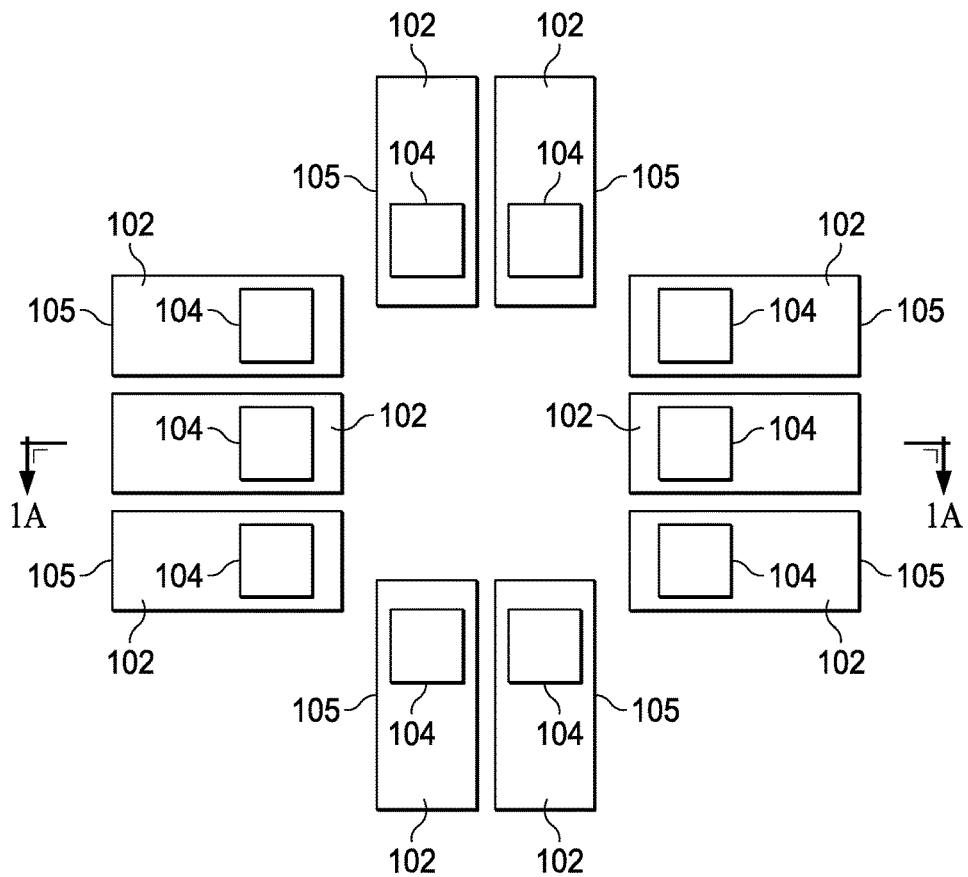
FIG. 1B is a top view of the lead frame in the packaged semiconductor device in FIG. 1A.

A packaged semiconductor device 100 is illustrated in the cross section in FIG. 1A. A semiconductor device 110 may be any semiconductor device, for example an integrated circuit, transistor, or diode. The semiconductor device 110 is attached to a lead frame 105 and covered with molding compound 112 to form the packaged semiconductor device 100. The semiconductor device package may be any package form, for example a dual in line package (DIP), a quad flat no lead (QFN) package or a flip chip small outline transistor (FCSOT) package or a radial package. A top view of the lead frame 105 in the packaged semiconductor device 100 is shown in FIG. 1B. The lead frame 105 is comprised of a number of leads 102 on which solder pads 104 are formed. The semiconductor device 110 is bonded to the lead frame 105 with solder joints 107 formed between metal posts 108 connected to input/output pads on the semiconductor device 110 and the solder pads 104. The number of leads 102 with solder pads 104 in a lead frame 105 may vary depending upon the number of solder joints 107 needed to mount the semiconductor device 110.

Another embodiment directly connects the solder pads 104 of the lead frame to input/output pages on the semiconductor device.

The cross section of the lead frame 105 in FIG. 1A is along the dashed line over the top view in FIG. 1B.

In the cross section of the packaged semiconductor device 100 in FIG. 1A, solder pads 104 are made of a material that solder easily wets. Solder joints 107 are formed between the solder pads 104 and metallic posts 108 that are connected to input/output (I/O) terminals of the semiconductor device 109. The metallic posts 108 typically are made of a conductive material such as copper, gold, or solder. Portions of this assembly is covered with molding compound 112 to form the packaged semiconductor device 100. Packaged semiconductor device 110 reliability failures may occur when the molding compound 112 delaminates from the lead frame 105 due to poor adhesion. To improve adhesion portions of the surface of the lead frame 105 may be roughened using wet chemical etching, for example.

The semiconductor device 110 is mounted on the first side (top side) of lead frame 105 as described above. Printed circuit board (PCB) solder pads 106 may be formed on the second side (bottom side) of the lead frame 105 to facilitate soldering the packaged semiconductor device 100 to leads on an underlying PCB.

The solder 104 pads on the topside of the lead frame 105 and the PCB solder pads 106 on the bottom side of the lead frame 105 are typically formed at additional cost by electroplating solderable metals such as palladium coated nickel using a masking process during the manufacture of the lead frame 105.

Figure 2A:
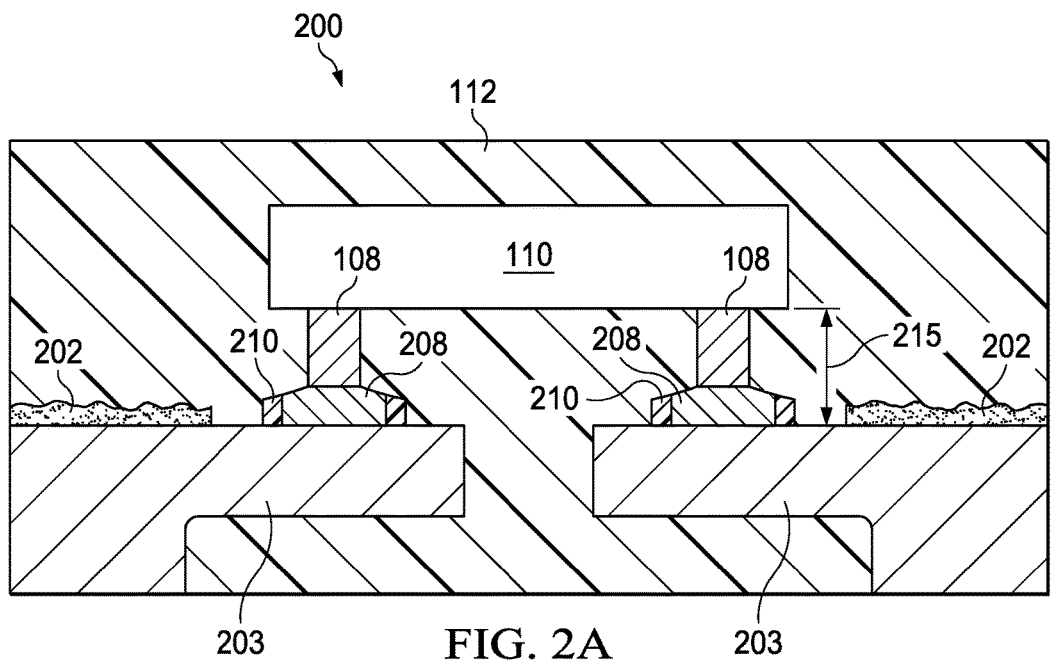
FIGS. 2A and 2B are cross-sections of packaged semiconductor devices with a lead frame, having a reflow wall and a particle roughened surface area.
Figure 2B:
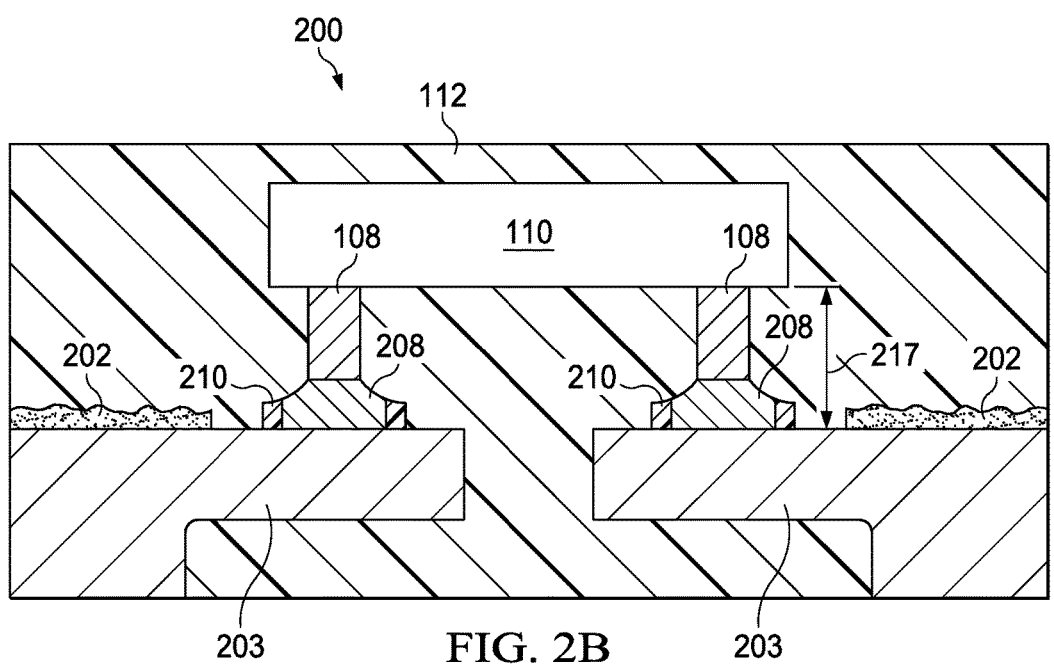

Cross sections of a packaged semiconductor device 200 with a semiconductor device 110 attached to a lead frame 203 with solder joints, 208, are illustrated in FIGS. 2A and 2B. A reflow wall 210 which either partially or completely surrounds the solder joint 208 restricts the lateral reflow of the solder during the formation of the solder joint 208 and consequently forms a taller solder joint 208. The solder joint 208 forms electrical connection between the lead frame 203 and the copper post 108 connected to an input/output (I/O) terminal on the overlying semiconductor device 110. The particle roughened surface 202 formed adjacent to the reflow wall 210 on the surface of the lead frame 203 is formed by bonding a particle containing polymeric material to the surface of the lead frame 203. The lead frame 203, reflow wall 210, solder joint 208, copper post 108, particle roughened surface 202, and semiconductor device 110 assembly are covered with molding compound 112 to form the packaged semiconductor device 200.

Figure 4:
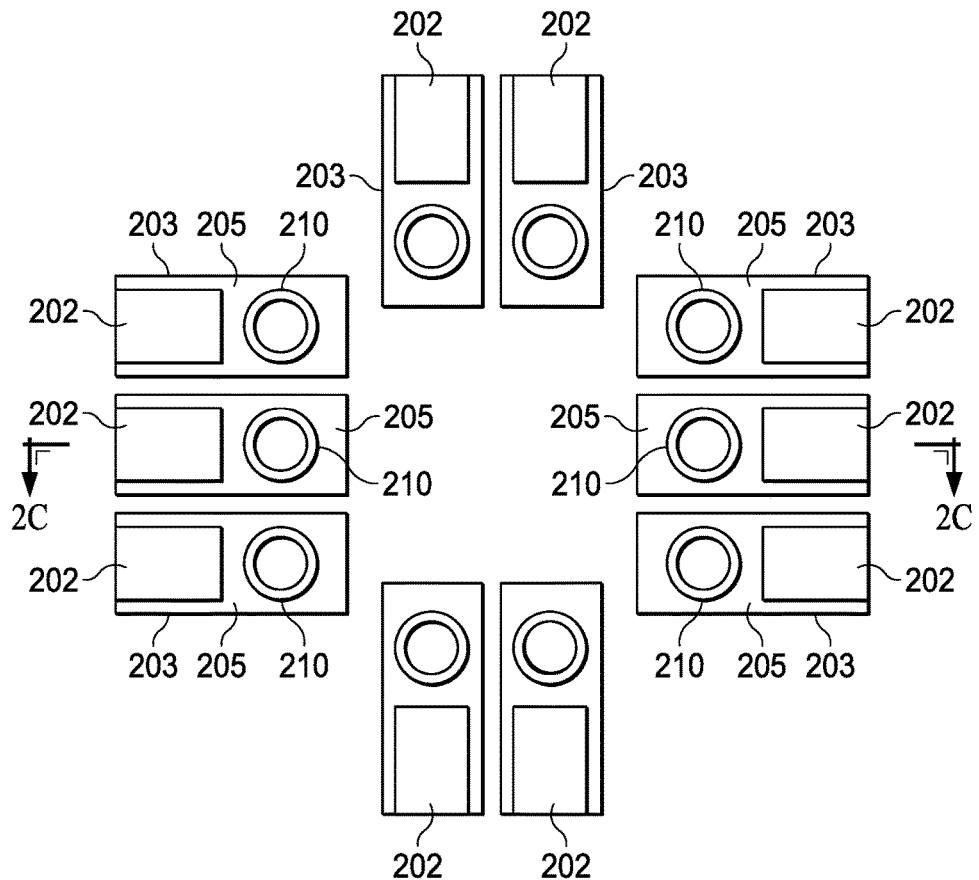
FIG. 4 is a top view of a lead frame having a reflow wall and a particle roughened surface.

A top view of the lead frame 203 is shown in FIG. 4. The lead frame 203 is comprised of number of leads 205 with particle roughened surfaces 202. Reflow walls 210 may also be formed on the leads 205 adjacent to the particle roughened surfaces 202.

The particle roughened surfaces 202 may be a particle containing polymeric material that is ink jet printed or screen printed onto a portion of the surface of lead frame 203 that is adjacent to the solder joints 208. The polymeric material may be a polyimide or epoxy resin. In one example, the particle roughened surface 202 includes an ink residue having polymeric material. The ink residue is formed in response to printing ink having polymeric material from an inkjet printer which is subsequently cured to form the ink residue having polymeric material. The particles that formed the particle roughened surface 202 are typically nonmetallic to avoid forming shorts. Particle sizes may range from nanometers to microns. Larger size particles may be used for screen printing pastes than may be used for ink jet printable inks. The particles may be regularly shaped such as spheres or ovals or may have irregular shapes.

The particle roughened surface 202 provides for improved adhesion between the molding compound 112 and the lead frame 203. The improved adhesion significantly reduces or eliminates packaged semiconductor device 200 failures due to delamination of the molding compound 112 from the lead frame 203.

Figure 3A:
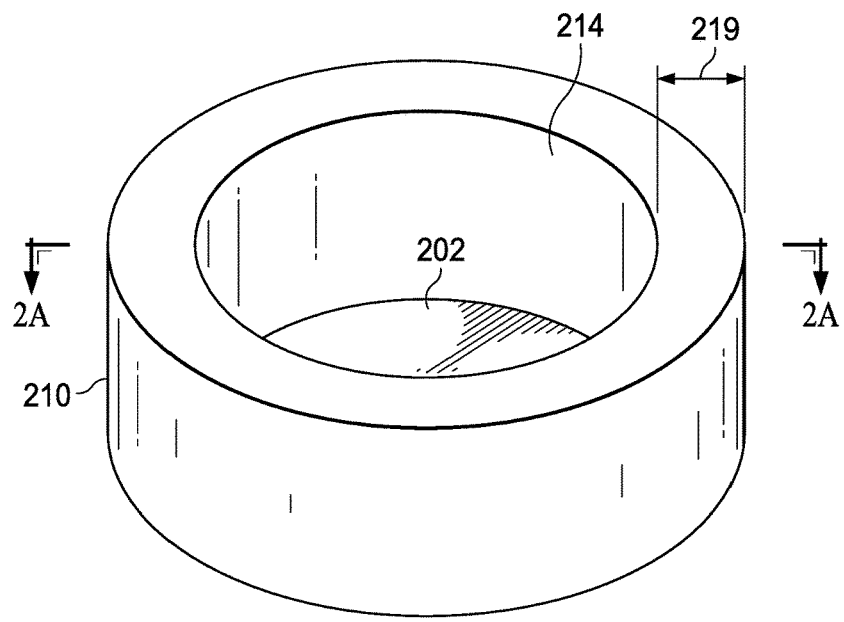
FIGS. 3A and 3B are views of reflow walls.
Figure 3B:
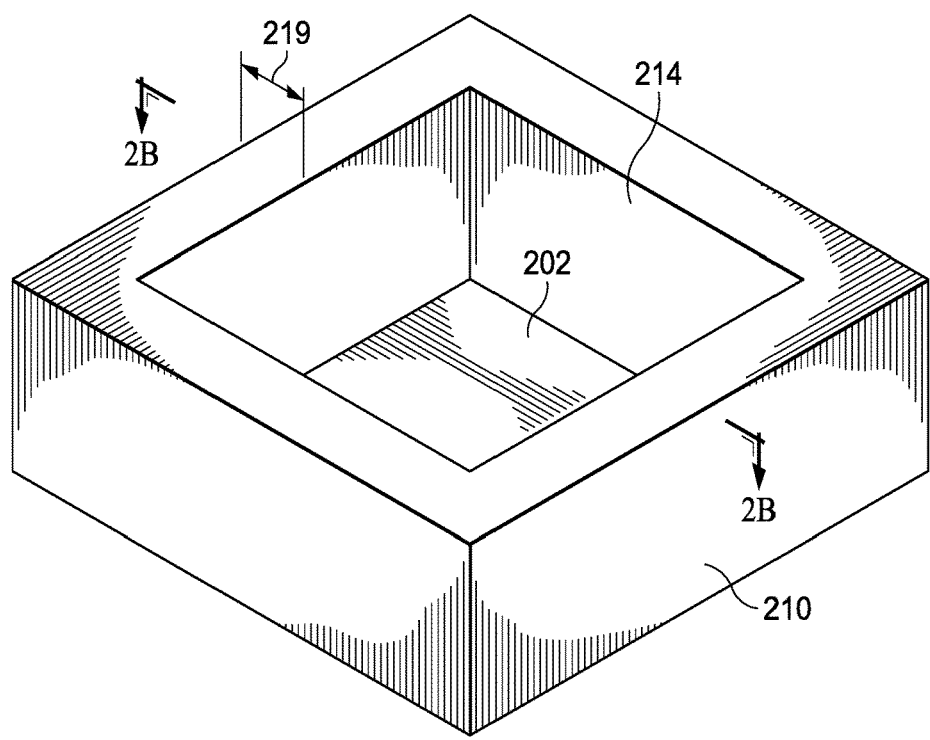

As is illustrated in FIGS. 3A and 3B, reflow walls 210 may completely surround the solder joint 208 or may confine the solder reflow on at least two sides. The inside surface 214 of solder wall 210 restricts the lateral flow of solder when the solder joint 208 is formed resulting in a taller solder joint 208. The taller solder joint 208 increases the distance 215 between the semiconductor device 210 and the lead frame 203. The increased distance reduces stress on the solder joint 208 as a result of the mismatch in thermal expansion (coefficient of thermal expansion (CTE) mismatch) between the semiconductor device 110 and the underlying lead frame 203 to which it is attached. Under some circumstances, particularly temperature extremes, mismatches in thermal expansion can lead to solder joint failure.

The reflow wall 210 may be formed of a polymeric material such as a polyimide, polyester, or epoxy or may be formed of a polymeric material containing nonmetallic or metallic particles. Particles embedded in the polymer reinforce the reflow wall 210. When the particles are formed of a solderable metal, the solder in the solder joint 208 may bond to the particles and increase the strength of the solder joint 208. The stronger solder joint 208 may reduce the failure rate of the solder joints 208 due to mechanical or thermal stress. A solderable metal may be a metal such as copper, silver, gold, platinum, nickel, palladium, brass, or alloys thereof that is easily wetted by molten solder during reflow.

Perspective views of example reflow walls 210 are shown in FIGS. 3A and 3B. Reflow walls have a thickness 219. Although circular and rectangular reflow walls 210 are depicted in FIGS. 3A and 3B other shapes such as ovals, octagons, squares, and other shapes may be used. The reflow walls 210 may completely surround the solder joint as shown in FIG. 3A in a circular shape or may confine the solder joint 208 on four sides of a rectangle as shown in FIG. 3B. The cross section of the reflow wall 210 in FIGS. 2A, and 2B are taken along the dashed line, 2A and 2B, in FIGS. 3A and 3B.

Figure 5A:
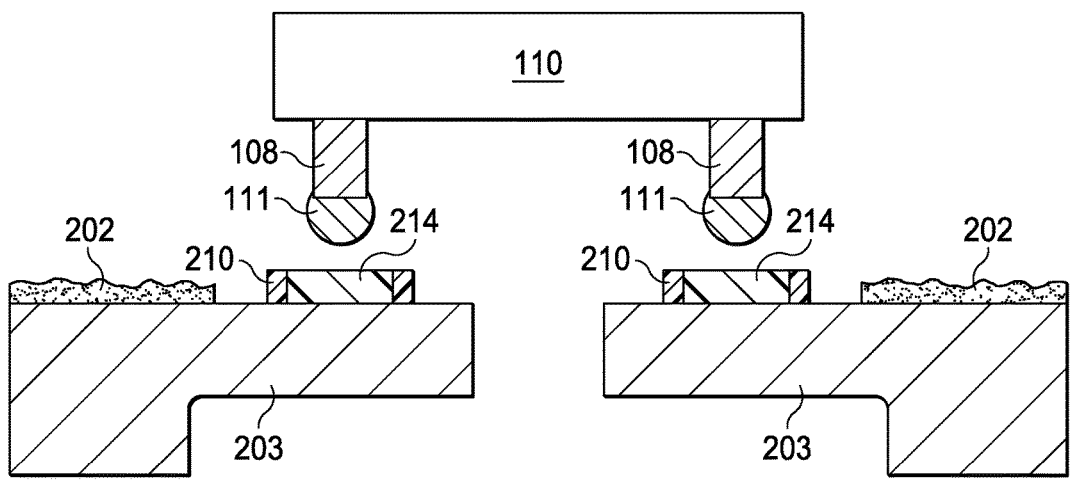
FIGS. 5A and 5B are cross section views of a lead frame and a semiconductor device illustrating the attachment of the semiconductor device to a lead frame.
Figure 5B:
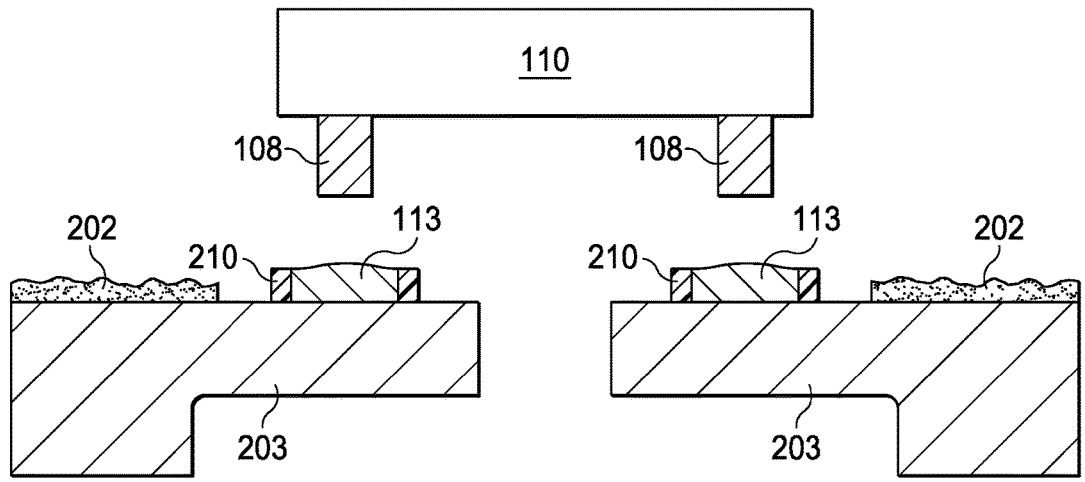

FIGS. 5A and 5B are cross sections illustrating the formation of solder joints between a semiconductor device 110 and a lead frame 203. As is illustrated in FIG. 5A, solder caps 111 on top of copper posts 108 that project downward from I/O's on the semiconductor device 110 may be positioned inside the reflow wall 210 prior to reflowing the solder and forming the solder joints 208 between the copper posts 108 and the surface of the lead frame 203. In a first alternative process as shown in FIG. 5B, the cavity between the reflow walls 210 may first be filled with a solder paste 113 and the top of the copper post 108 brought into contact with the solder paste 113 prior to reflowing the solder paste 113 and forming the solder joint 208. In a second alternative process the cavity between the reflow walls 210 may be filled with a solder paste 113 and a copper post 108 with a solder cap 111 may brought into contact with the solder paste 113 prior to reflowing the solder paste 113 and forming the solder joint 208.

The volume of solder in the solder cap 111 or the volume of the solder paste 113 inside the cavity between the reflow walls 210 is chosen so the solder joint 208 is at least as tall as the solder wall 210. The volume of the solder 111, 113 is preferably chosen so that the height of the solder joint is greater than the height of the solder wall. The height of the solder joint 208 may be increased by increasing the height of the reflow wall 210. Increased height of the solder joint 208 may improve solder joint reliability.

Figure 6:
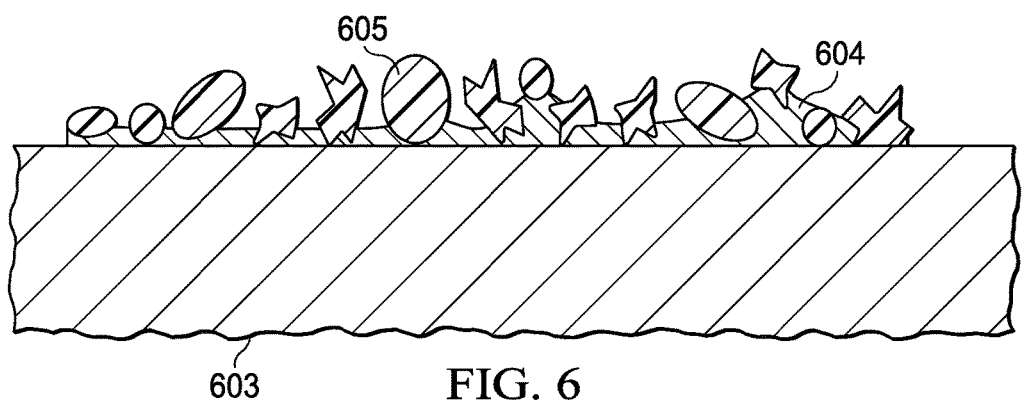
FIG. 6 is a cross section view of a lead frame with a particle roughened surface.

The particle roughened surface 202 in FIG. 6 may be formed using ink jet printing to dispense a particle containing ink onto the surface of the lead frame 603. The ink may be comprised of particles 605 dispersed in a resin 604 such as a polyimide or epoxy resin. After the ink is dispensed onto the surface, the ink may be thermally cured at a temperature in the range of about 80° C. to 300° C. to drive off solvent forming the particle roughened surface 202.

Alternatively screen printing may be used to apply a screen print paste to the surface of the lead frame 603. The screen print paste may be formed of particles 203 dispersed in a resin 604 such as a polyimide or epoxy resin. After the screen print paste is dispensed onto the surface it may be thermally cured at a temperature in the range of about 180 C to 300 C to drive off solvent forming the particle roughened surface 202.

Figure 7A:
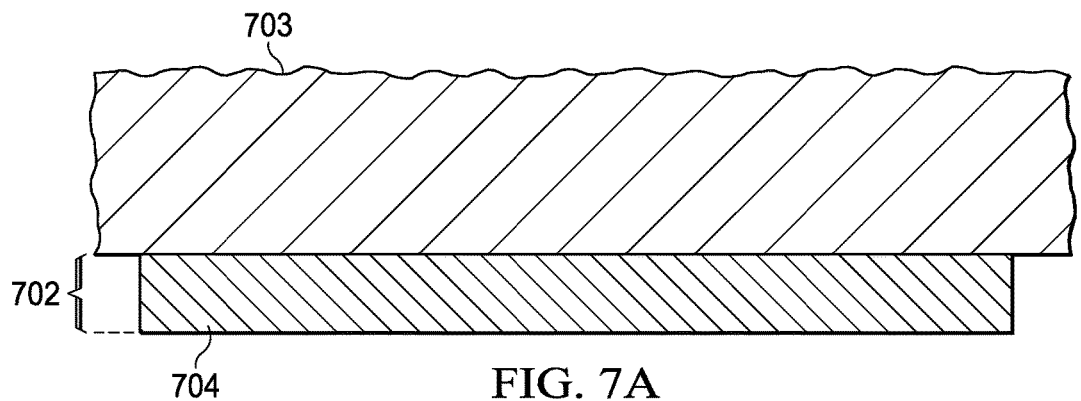
FIGS. 7A and 7B are cross section views of lead frames with printed circuit board solder pads on the bottom side of the lead frame.
Figure 7B:
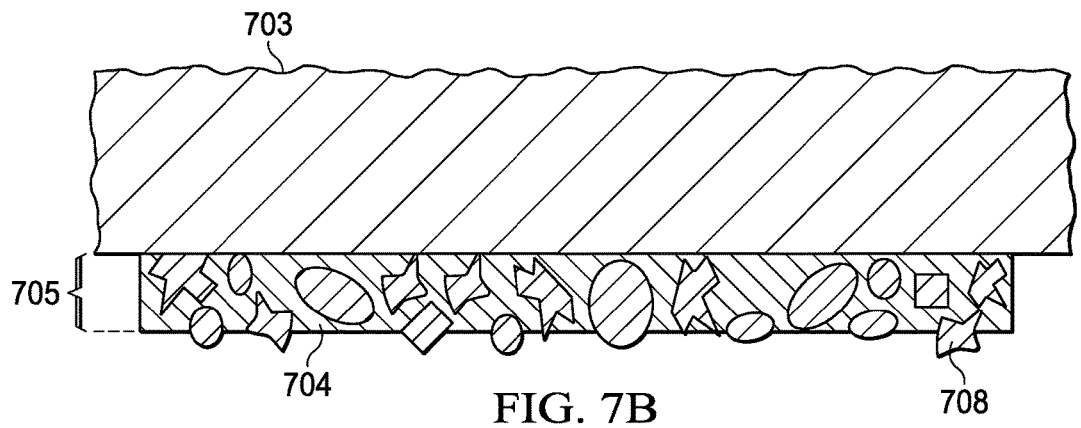
Figure 9A:
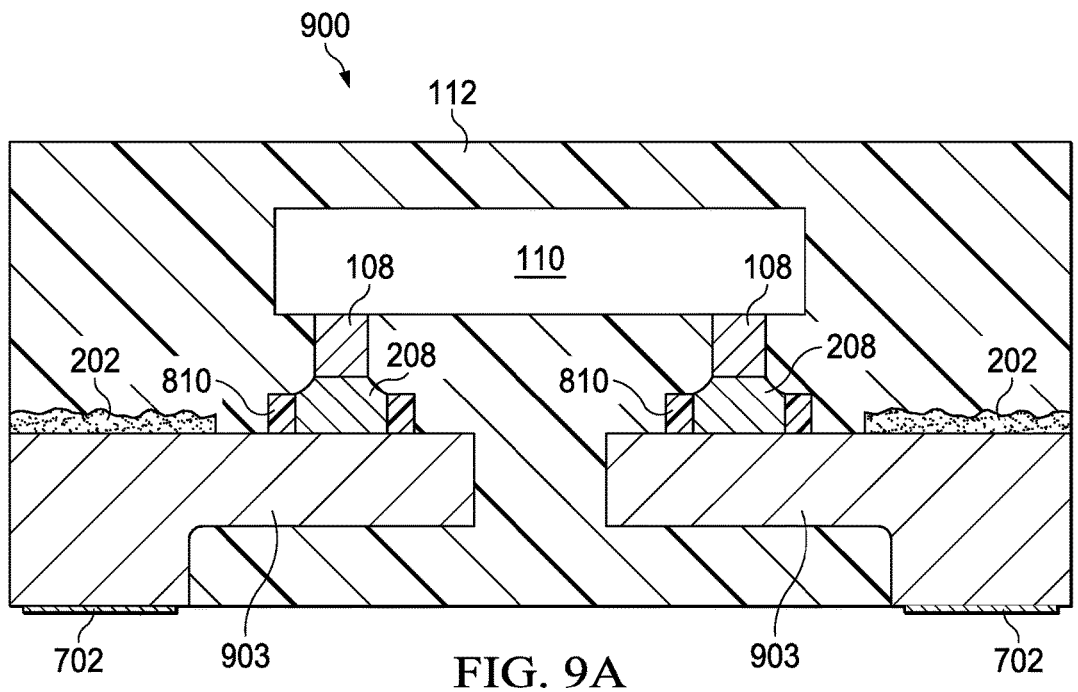
FIGS. 9A, 9B, and 9C, are cross section views of packaged semiconductor devices with particle roughened surfaces, reflow walls, and printed circuit board solder pads on the bottom side formed.
Figure 9B:
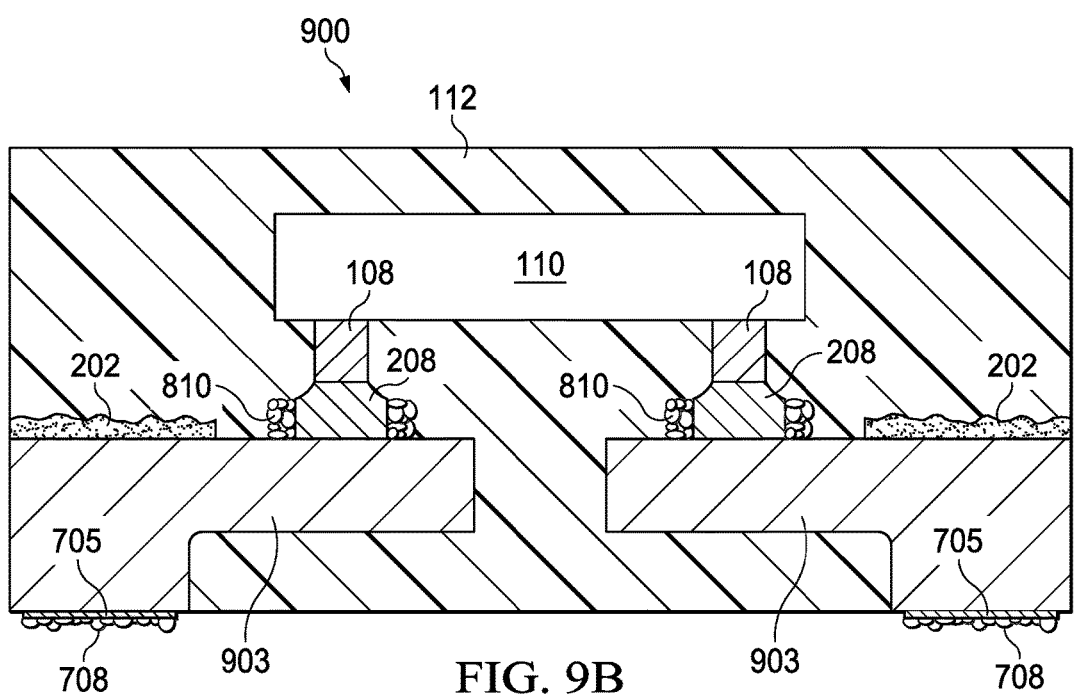

As is illustrated in FIGS. 7A and 7B, PCB solder pads 702 and 705 may be formed on the bottom side of the lead frame 703. FIG. 7A shows a PCB solder pad 702 formed using solder paste 704. Shown in FIG. 9A is a packaged semiconductor device 900 with a PCB solder pad 702 formed on the bottom side of the packaged semiconductor device 900 using solder paste 704. FIG. 7B shows a PCB solder pad 705 on the bottom side of the lead frame 703 formed using a solder paste 704 in which solderable particles 708 are dispersed. Shown in FIG. 9B is a packaged semiconductor device 901 with a PCB solder pad 705 formed on the bottom side using solder paste 704 in which solderable particles 708 are dispersed. The solderable particles 708 may be formed of metals such as silver, gold, platinum, nickel, palladium, brass, or alloys thereof. The solderable particles 708 add reinforcement to solder joints formed between the PCB solder pad 705 on the bottom side of the lead frame 703 and an electrical lead on a printed circuit board. Forming PCB solder pads 702 and 705 on the bottom side of the lead frame 903 using ink jet printing or screen printing eliminates the expensive step of electroplating these pads during lead frame 903 manufacture.

Figure 8A:
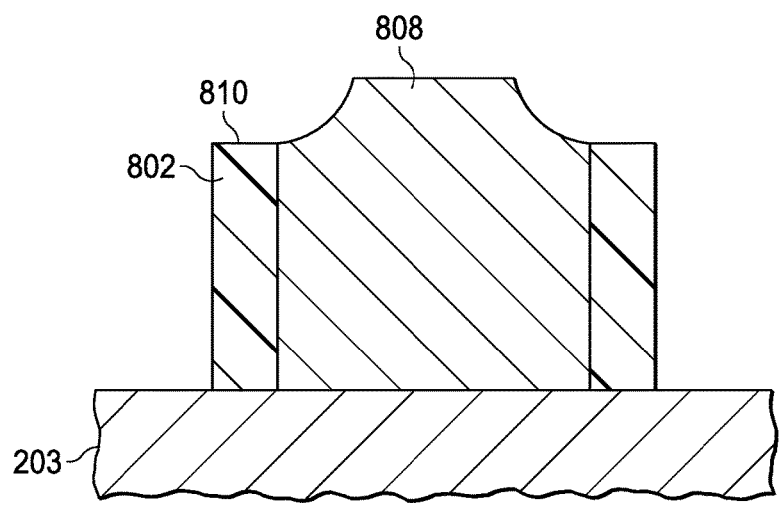
FIGS. 8A, 8B, and 8C are cross section views of a lead frame with reflow walls formed in accordance with embodiments.
Figure 8B:
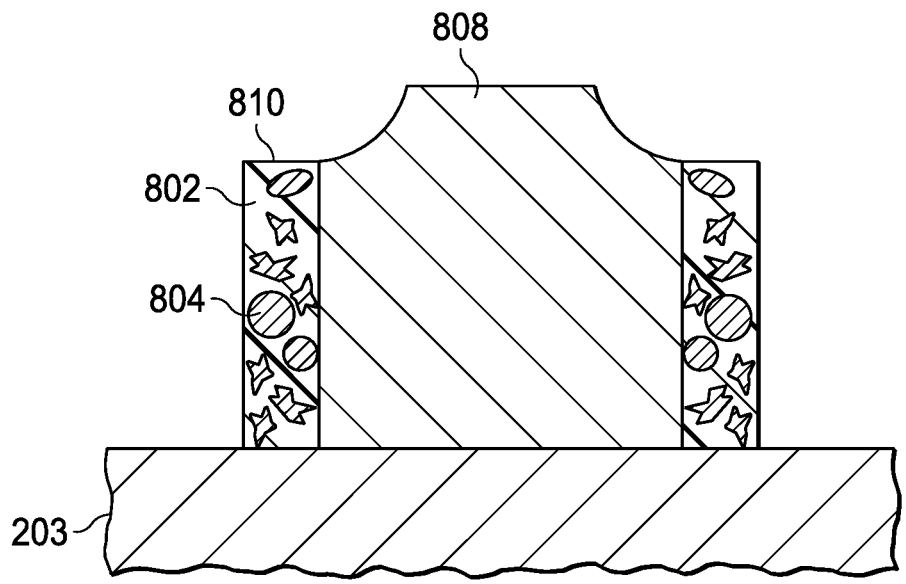
Figure 8C:
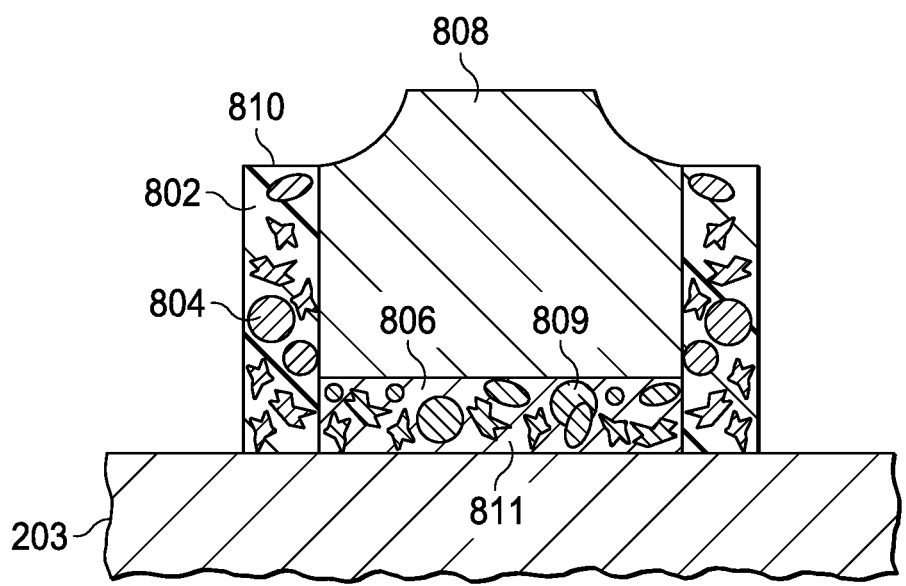
Figure 9C:
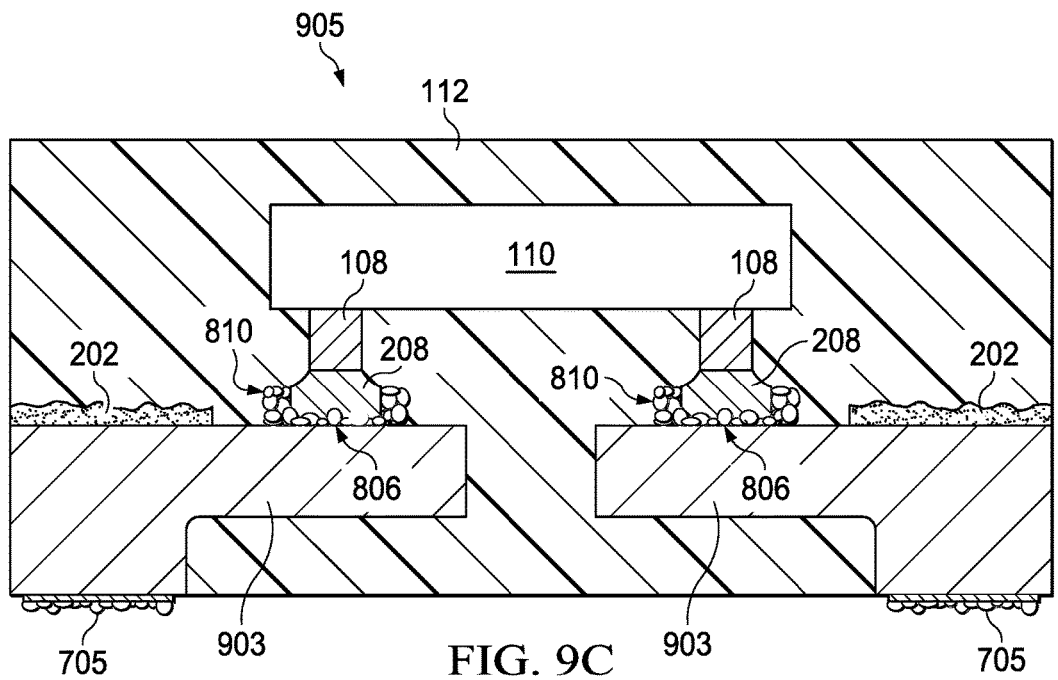

FIGS. 8A, 8B, and 8C illustrate a few reflow sidewall 810 options. FIG. 8A shows a reflow sidewall 810 that is composed of a polymeric material 802 such as polyimide, epoxy or polyester. Shown in FIG. 9A is a packaged semiconductor device 900 with a reflow sidewall 810 composed of a polymeric material 802. FIG. 8B shows a reflow sidewall 810 that is composed of solderable particles 804 dispersed in a polymeric material 802. FIG. 9B shows a packaged semiconductor device 901 with a reflow sidewall 810 composed of solderable particles 804 dispersed in a polymeric material 802. FIG. 8C shows a reflow sidewall 810 that is composed of solderable particles 804 dispersed in a polymeric material 802. A solder pad 806 that is composed of solderable particles 809 dispersed in solder flux 811 is formed on the surface of the lead frame 903 between the reflow walls 810. FIG. 9C shows a packaged semiconductor device 905 with a reflow sidewall 810 composed of solderable particles 804 dispersed in a polymeric material 802 and with a solder pad 806 that is composed of solderable particles 809 dispersed in solder flux 811 on the surface of the lead frame 903 between the reflow walls 810. In one example, the solderable particles 804 dispersed in solder flux 811 is deposited on the surface prior to attaching the solder joint 208.

Figure 10:
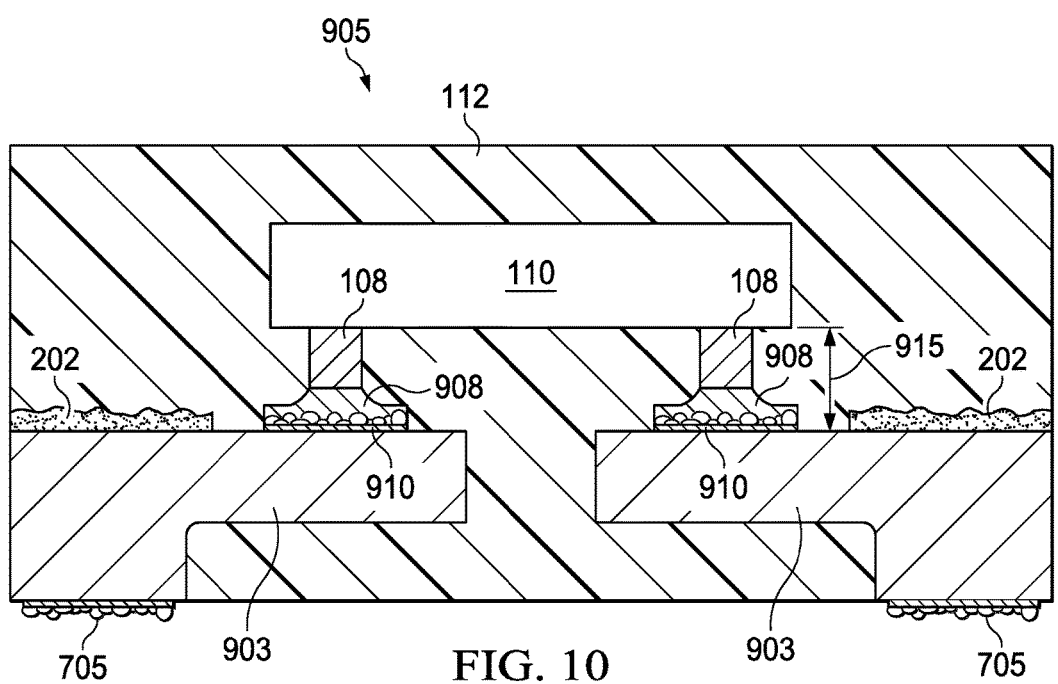
FIG. 10 is a cross section view illustrating a packaged semiconductor device with particle roughened surfaces and a solder pad on the top side of the lead frame and with a printed circuit board solder pad on the bottom side of the packaged semiconductor device.

As is illustrated in FIG. 10, solder pads 910 may be formed on the topside of the lead frame 903 where the semiconductor device 110 is mounted to form packaged semiconductor device 907. These topside solder pads 910 may be formed using the same material and process as is used to form the PCB solder pads, 702 and 705, on the bottom side of the lead frame 903.

The major steps for forming particle roughened surface areas 202 and reflow walls 810 are described in cross sections in FIGS. 11A through 11C and FIGS. 13A through 13C.

Figure 11A:
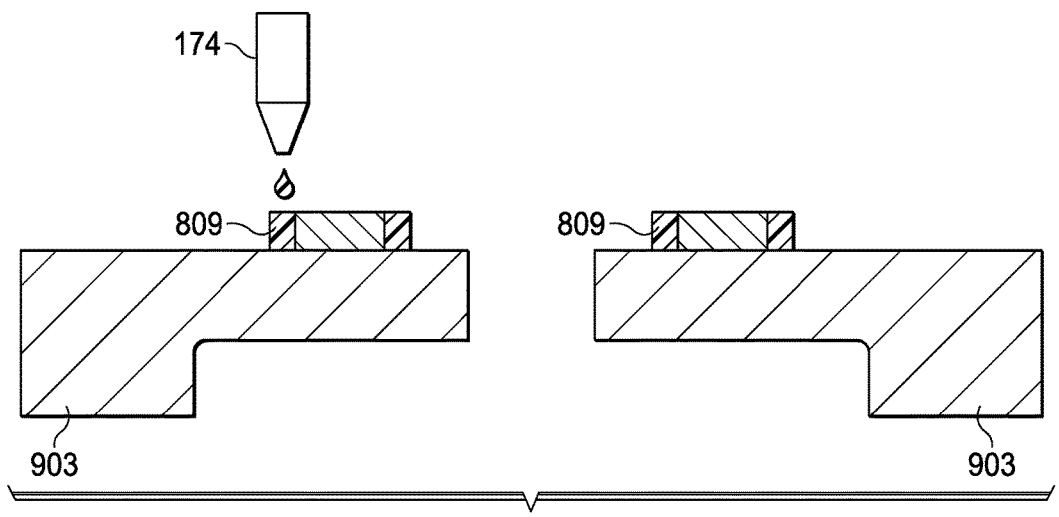
FIGS. 11A through 11C are cross section views illustrating the major manufacturing steps in forming particle roughened surfaces and reflow walls using ink jet printing.
Figure 11B:
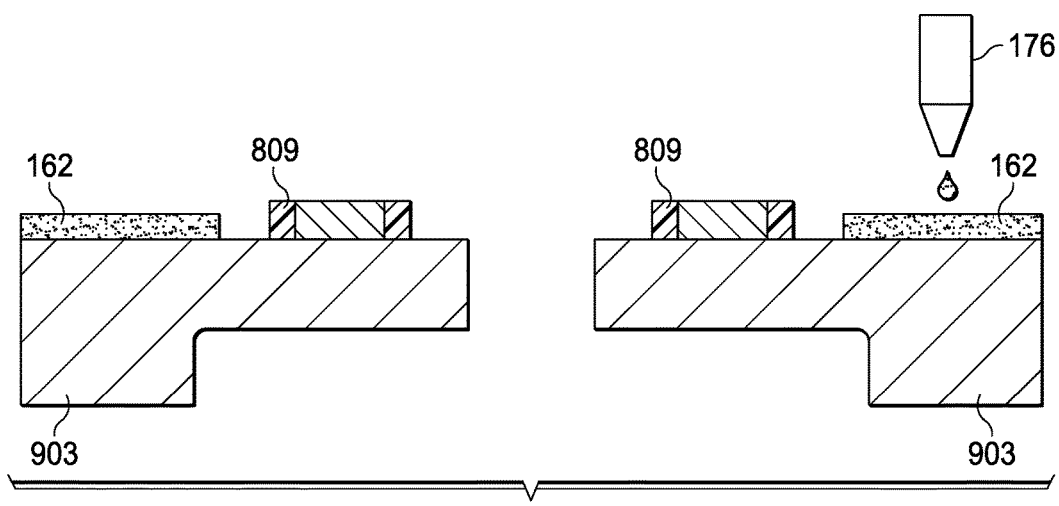
Figure 11C:
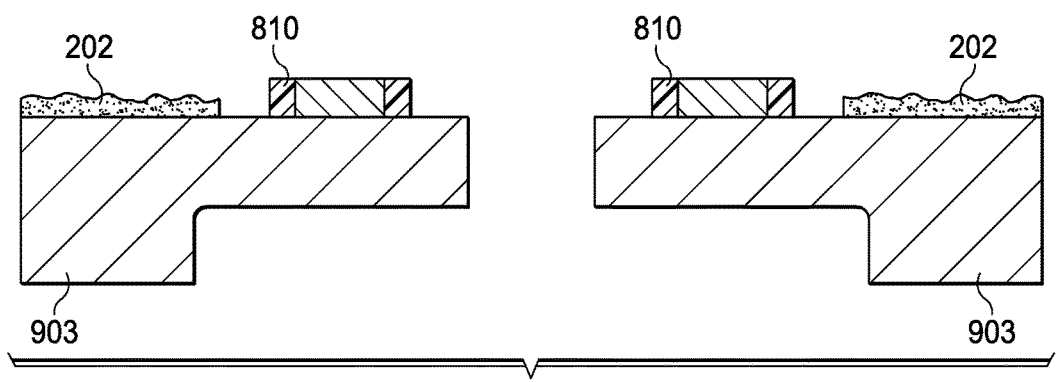

A first method for forming reflow walls 809 and a particle roughened surface 202 on a lead frame 903 using ink jet printing is illustrated in FIGS. 11A through 11C.

In FIG. 11A the reflow wall 809 is printed onto the surface of the lead frame 903 using an ink jet printer 174.

FIG. 11B illustrates the deposition of a particle roughened surface 162 on the lead frame 903 using an ink jet printer 176. The ink may be the same ink used to print the reflow wall 810 or it may be a different ink.

FIG. 11C shows the structure after sintering at a temperature in the range of about 80° C. and about 300° C. to form the particle roughened surface 202 and to form the reflow wall 810.

Figure 13A:
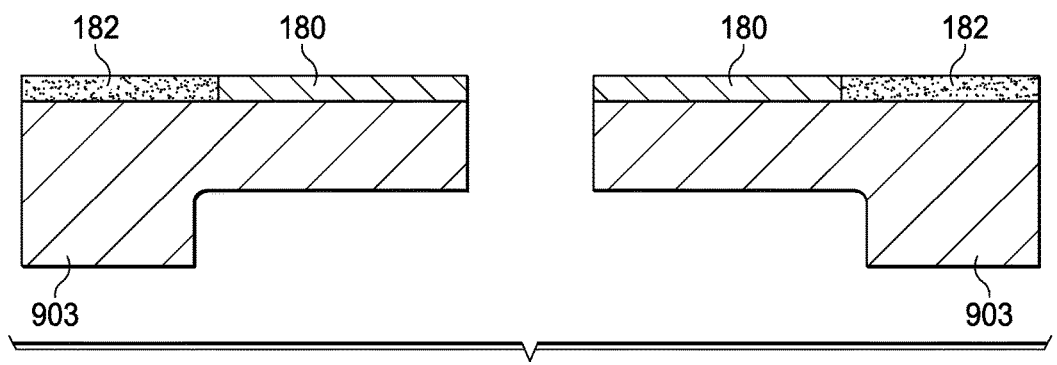
FIGS. 13A through 13C are cross section views illustrating the major manufacturing steps in forming particle roughened surfaces and reflow walls using screen printing.
Figure 13B:
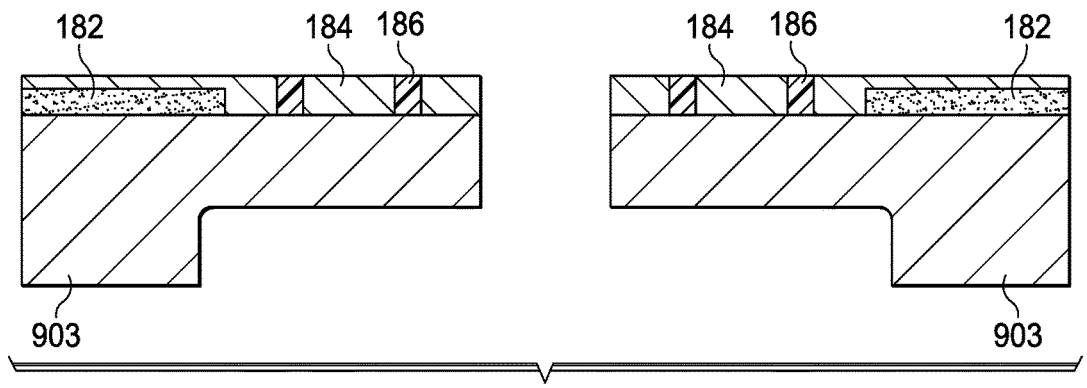
Figure 13C:
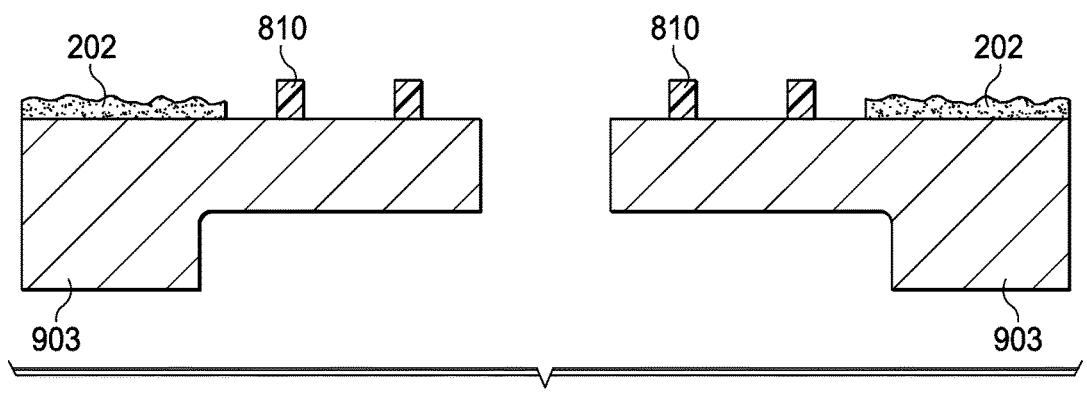

A second method for forming a particle roughened surface 202 and reflow walls 810 on a lead frame 903 using screen printing is illustrated in FIGS. 13A through 13C.

In FIG. 13A a first stencil 180 is positioned on the surface of the lead frame 903 and a first paste 182 is applied to areas where a particle roughened surface 202 is to be formed. The first stencil 180 is removed after the first paste 182 is applied.

In FIG. 13B a second stencil 184 is positioned on the surface of the lead frame 903 and a second paste 186 is applied to areas where the reflow walls 810 are being formed. The second stencil 184 is removed after the second paste 184 is applied.

FIG. 13C shows the lead frame 903 after the pastes are sintered at a temperature in the range of about 80° C. and about 300° C. to form the reflow wall 810 and the particle roughened surface 202.

The method illustrated in FIG. 13A through 13C, enables the reflow wall 810 and particle roughened surface 202 to be formed with different thicknesses and to be formed using different pastes. Alternatively, one stencil with openings for both reflow walls 810 and for particle roughened surface 202 may be utilized. In this case the same paste may be used to form both the reflow walls 810 and the particle roughened surface 202. This method may be used to reduce manufacturing cost.

Figure 12A:
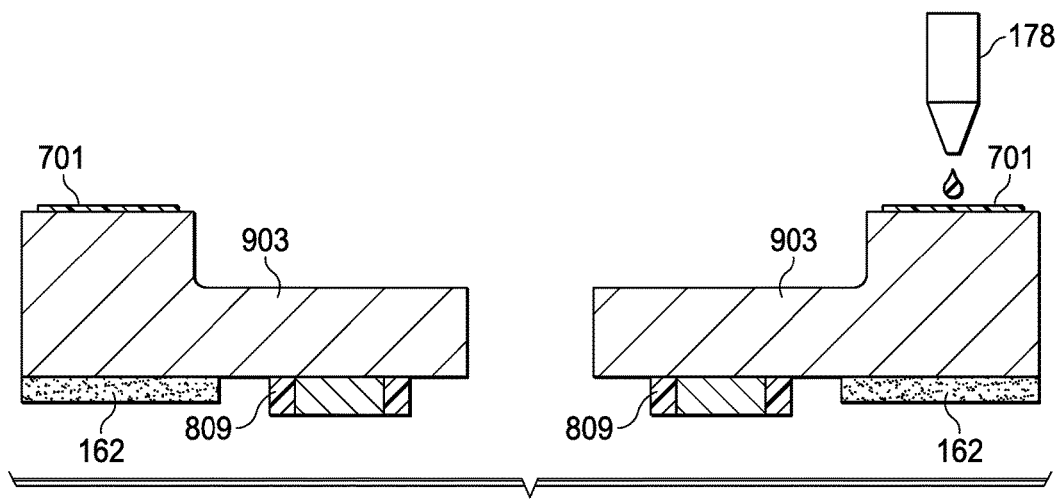
FIGS. 12A and 12B are cross section views illustrating the major manufacturing steps in forming printed circuit board solder pads on the bottom side of the lead frame using ink jet printing.
Figure 12B:
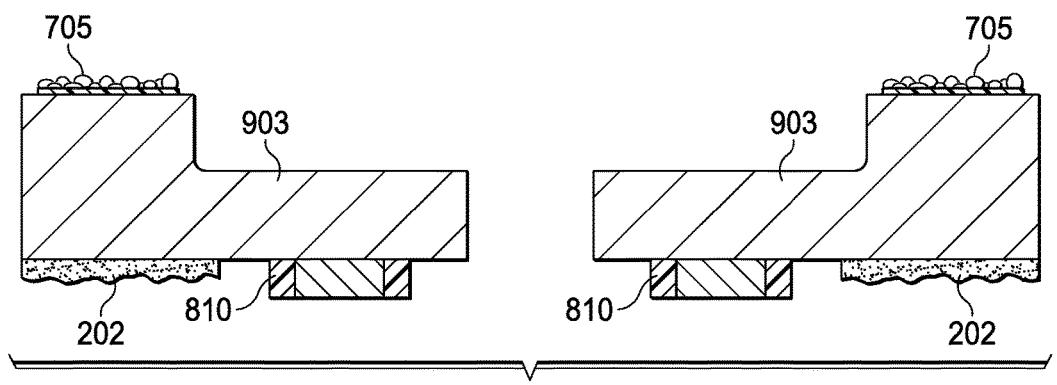
Figure 14A:
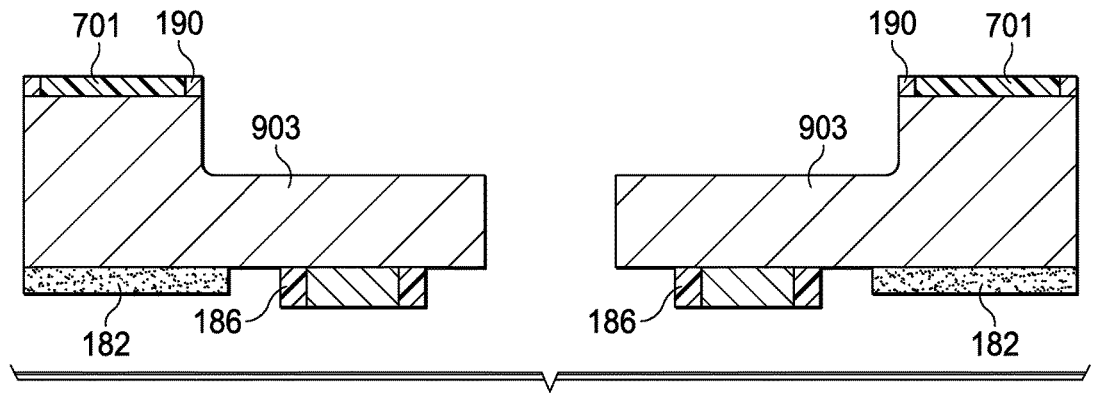
FIGS. 14A and 14B are cross sections illustrating the major manufacturing steps in forming printed circuit board solder pads on the bottom side of a lead frame using screen printing.
Figure 14B:
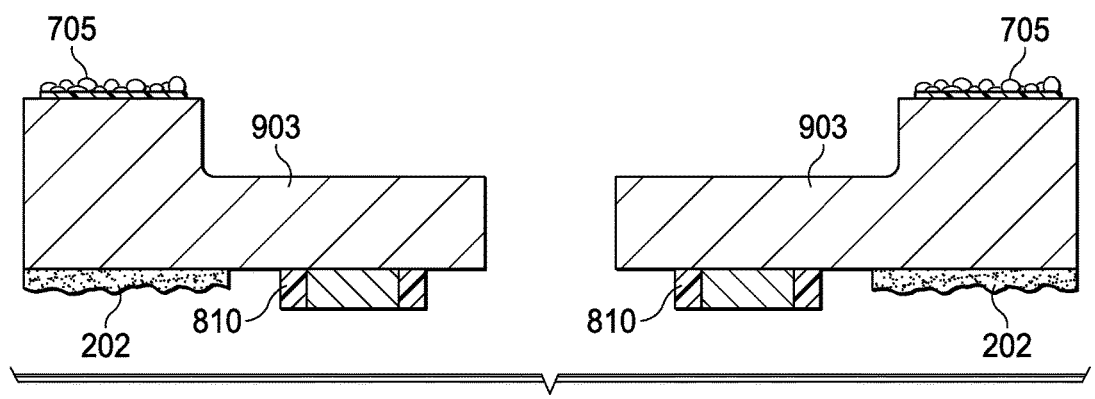

The major steps for forming PCB solder pads 705 on the backside of the lead frame 903 are described in cross sections in FIGS. 12A and 12B, and in FIGS. 14A and 14B.

FIGS. 12A and 12B illustrate steps in the formation of the PCB solder pads 705 on the bottom side of the lead frame 903 using ink jet printing. As is illustrated in FIG. 12A, the PCB solder pads 701 are printed using an ink jet printer 178. FIG. 12B shows PCB solder pads 705 after the ink is sintered at a temperature in the range of about 80° C. and about 300° C. to drive off solvent and to cure the ink resin.

FIGS. 14A and 14B illustrate the formation of PCB solder pads 705 on the backside of the lead frame 903 using screen printing.

In FIG. 14A a stencil 190 is applied to the bottom side of the lead frame 903 with openings where the PCB solder pads 705 are to be formed. The stencil 190 is removed after the paste 704 is applied.

FIG. 14B shows the lead frame 903 after the paste 192 is sintered at a temperature in the range of about 80° C. and about 300° C. to form the PCB solder pads 705 on the bottom side of the lead frame 903.

In various example embodiments, terms such as top, bottom, and the like are used in a relative sense to describe a positional relationship of various components. These terms are used with reference to the position of components shown in the drawings, and not in an absolute sense with reference to a field of gravity. For example, the top side of the lead frame 105 would still be properly referred to as the top side of the lead frame, even if the packaged semiconductor devices are placed in an inverted position with respect to the position shown in the drawings.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A packaged semiconductor device comprising:
a substrate;
a semiconductor device electrically connected to the substrate;
a particle roughened surface on a portion of a surface of the substrate and comprised of a first polymer containing first particles; and
molding compound covering portions of the semiconductor device, the substrate, and the particle roughened surface.

2. The packaged semiconductor device of claim 1, in which the first polymer is selected from a group consisting of a polyimide, epoxy, and polyester polymer.

3. The packaged semiconductor device of claim 1, in which the first particles are nonmetallic particles.

4. The packaged semiconductor device of claim 1 further comprising a solder joint electrically connecting the semiconductor device to the substrate, in which the particle roughened surface covers portions of the surface of the substrate adjacent to the solder joint.

5. The packaged semiconductor device of claim 4 further comprising:
a reflow wall that surrounds the solder joint in which the reflow wall is a second polymer selected from the group consisting of polyimide, epoxy, and polyester.

6. The packaged semiconductor device of claim 5, in which the reflow wall surrounds the solder joint on at least two opposing sides of the solder joint.

7. The packaged semiconductor device of claim 5, in which the reflow wall completely surrounds the solder joint.

8. The packaged semiconductor device of claim 5, comprising of a second polymer containing second particles.

9. The packaged semiconductor device of claim 5, in which a height of the solder joint is at least as high as a height of the reflow wall.

10. A packaged semiconductor device comprising:
a substrate;
a semiconductor device electrically connected to the substrate;
a particle roughened surface formed of ink residue on a portion of a surface of the substrate and comprised of a first polymer containing first particles; and
molding compound covering portions of the semiconductor device, the substrate, and the particle roughened surface.

11. The packaged semiconductor device of claim 10, in which the first polymer is selected from a group consisting of a polyimide, epoxy, and polyester polymer.

12. The packaged semiconductor device of claim 10, in which the first particles are nonmetallic particles.

13. The packaged semiconductor device of claim 10 further comprising a solder joint electrically connecting the semiconductor device to the substrate, in which the particle roughened surface covers portions of the surface of the substrate adjacent to the solder joint.

14. The packaged semiconductor device of claim 13 further comprising:
a reflow wall that surrounds the solder joint in which the reflow wall is a second polymer selected from the group consisting of polyimide, epoxy, and polyester.

15. The packaged semiconductor device of claim 10, in which the substrate is a portion of a lead frame.

16. A packaged semiconductor device comprising:
a substrate; and
a semiconductor device electrically connected to the substrate via a connection mechanism, the connection mechanism including a solder and reflow side walls surrounding solder including particles in a first polymer, and a solder pad at an interface between the solder and the substrate, the solder pad including particles dispersed in solder flux.

17. The packaged semiconductor device of claim 16 further comprising:
a particle roughened surface, on a portion of a surface of the substrate, comprised of a second polymer material containing first particles; and
molding compound covering portions of the semiconductor device, the substrate, the metallic post, the connection mechanism, and the particle roughened surface.

18. The packaged semiconductor device of claim 16, in which the particles are solderable particles.

19. The packaged semiconductor device of claim 16, in which the first polymer is selected from the group consisting of polyimide, epoxy, and polyester.

20. The packaged semiconductor device of claim 16, in which the first polymer is selected from the group consisting of polyimide, epoxy, and polyester polymers and wherein the particles are nonmetallic particles.

* * * * *